United States Patent
Aramaki et al.

(10) Patent No.: US 7,303,998 B2
(45) Date of Patent: Dec. 4, 2007

(54) PLASMA PROCESSING METHOD

(75) Inventors: Tooru Aramaki, Kudamatsu (JP);
Tsunehiko Tsubone, Hikari (JP);
Ryujiro Udo, Ushiku (JP); Motohiko Yoshigai, Hikari (JP); Takashi Fujii, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 362 days.

(21) Appl. No.: 11/002,265

(22) Filed: Dec. 3, 2004

(65) Prior Publication Data

US 2005/0242060 A1    Nov. 3, 2005

Related U.S. Application Data

(63) Continuation of application No. 10/655,046, filed on Sep. 5, 2003.

(51) Int. Cl.
*H01L 21/302* (2006.01)
(52) U.S. Cl. ............ 438/715; 438/706; 438/714; 156/345.52
(58) Field of Classification Search .......... 438/706, 438/710, 714, 715; 156/345.51, 52
See application file for complete search history.

(56) References Cited

U.S. PATENT DOCUMENTS 5,490,228 A * 2/1996 Soma et al. ............ 392/416
2003/0039951 A1* 2/2003 Cheung et al. ......... 434/365

FOREIGN PATENT DOCUMENTS

| JP | 1-251735 | 10/1989 |
| JP | 9-017770 | 1/1997 |

* cited by examiner

*Primary Examiner*—Lan Vinh
(74) *Attorney, Agent, or Firm*—Antonelli, Terry, Stout & Kraus, LLP.

(57) ABSTRACT

A plasma processing method for processing a sample by reducing a pressure within a processing chamber, including mounting the sample on a sample holder disposed in the processing chamber, and processing using a plasma generated in the processing chamber above the sample holder while supplying a gas for heat transfer to a space between a surface of the sample holder having the sample mounted thereon and a rear surface of the sample. The sample holder has a plurality of substantially ring-shaped depressed portions at the surface where the sample is mounted. A pressure in a space between the depressed portions arranged at a central portion of the sample holder with respect to outer circumferential portion and the sample is set to be lower than a pressure in a space between the depressed portions at the outer circumferential portion and the sample.

10 Claims, 13 Drawing Sheets

NOTE: EACH ARROW IN DRAWING INDICATES FLOW OF HEAT TRANSFER GAS

DETAILED CROSS SECTION
ALONG B-B OF FIG. 5

DETAILED CROSS SECTION
OF PORTION A OF FIG. 5

EXHAUST

PLASMA PROCESSING METHOD

CROSS REFERENCE TO RELATED APPLICATION

This is a continuation of U.S. application Ser. No. 10/655,046, filed Sep. 5, 2003, the subject matter of which is incorporated by reference herein.

FIELD OF THE INVENTION

The present invention relates to a plasma processing apparatus for processing a sample, such as a semiconductor substrate, placed on a sample holder in a processing vessel by using a plasma generated in the processing vessel. More particularly, it relates to a plasma processing apparatus having a sample holder for processing a sample, while adjusting the temperature of the sample.

BACKGROUND OF THE INVENTION

When the sample is processed by using the plasma formed in the processing vessel as described above, such factors as a temperature distribution in a direction across the sample holder which carries the sample placed thereon during the processing, the density distribution of the plasma, and the distribution of reaction products decrease uniformity of processing across the surface of the sample, which presents a problem. As conventional means for solving the problem, a technology for controlling the temperature distribution across the surface of the sample holder and thereby adjusting the temperature distribution across the surface of the sample such that the processing is performed uniformly has been proposed.

An exemplary conventional technology is disclosed in Japanese Patent Laid-Open No. H 9(1997)-17770, which provides plural systems of refrigerant channels in a sample holder to provide a non-uniform temperature distribution across the sample holder and thereby render the temperature of the sample uniform (Prior Art Technology 1)

There has also been known another conventional technology disclosed in Japanese Patent Publication No. 2680338, which locally varies the pressure of a gas supplied to the back surface of the sample and thereby renders the temperature of the sample uniform (Prior Art Technology 2).

Although each of the foregoing prior-art technologies has examined a structure for controlling the temperature distribution across the surface of the sample, they have the following problems.

Since the prior art technology 1 requires a long time from the time the refrigerant temperature is changed until the sample temperature is changed and stabilized, it presents a problem when a plurality of different processes are performed individually on a per step basis with respect to a single wafer on a single sample holder. If each of the processes is not initiated until the temperature is stabilized, the time during which the processes are not performed increases so that the overall processing efficiency lowers. If each of the processes is initiated by the time the temperature is not stabilized, on the other hand, another problem is encountered that the process cannot be performed with high precision.

In addition, the prior art technology 1 has not considered the mutual thermal influence between the portion of the sample closer to the center thereof and the portion of the sample closer to the outer periphery thereof even in the case of performing a process which requires a large difference between the respective temperature values of the portion closer to the center and the portion closer to the outer periphery. Consequently, the temperature varies gradually so that a desired temperature distribution is not provided.

The prior art technology 2 adjusts heat transfer between the sample and the sample holder by varying the pressure of a gas for heat transfer supplied to the back surface of the sample under processing at desired positions on the back side of the sample and thereby suppresses fluctuations in temperature across the surface of the sample in a shorter period of time. However, since it is impossible to adjust the temperature only when heat is inputted from the plasma to the wafer, a predetermined temperature distribution cannot be obtained if heat supplied from a stably formed plasma and from a member in the processing vessel under the influence of the plasma varies greatly till it reaches a normal state and if the processing time is short. In the case of performing a process which requires a large difference between the respective temperatures of the portion of the sample closer to the center thereof and the portion of the sample closer to the outer periphery thereof, if the amount of heat from the plasma is small, the temperature distribution that can be provided is limited so that it is difficult to produce a large temperature difference.

It is therefore an object of the present invention to provide a plasma processing apparatus capable of adjusting the temperature of a wafer in a wide range and processing a sample to be processed with high precision.

Another object of the present invention is to provide a plasma processing apparatus which allows a desired temperature distribution to be realized within a wafer in a shorter period of time and thereby performs processing with higher efficiency.

SUMMARY OF THE INVENTION

The foregoing objects are attained by a plasma processing apparatus for processing a sample to be processed with a plasma generated by using a gas, the apparatus comprising: a processing chamber having an inner space reduced in pressure; a sample holder on which the sample is placed, the sample holder being disposed in the processing chamber; and a plurality of openings through which the gas is introduced into the processing chamber, the plurality of openings being located above the sample holder, wherein the sample holder on which the sample is placed has: ring-shaped projecting portions disposed concentrically on a surface of the sample holder to have respective surfaces thereof in contact with a surface of the sample and partition a space between the surface of the sample and the surface of the sample holder into a plurality of regions; a first opening located in a first region, which is the circumferentially outermost one of the plurality of regions, to introduce a gas for heat transfer therethrough; and a second opening located in a second region, which is internal of the circumferentially outermost region, to allow the gas in the region to flow out therethrough.

The foregoing objects are also attained by a plasma processing apparatus for processing a sample to be processed with a plasma generated by using a gas, the apparatus comprising: a processing chamber having an inner space reduced in pressure; a sample holder on which the sample is placed, the sample holder being disposed in the processing chamber; and a plurality of openings through which the gas is introduced into the processing chamber, the plurality of openings being located above the sample holder, wherein the sample holder on which the sample is placed has: a plurality of ring-shaped depressed portions over which the sample is placed, the plurality of ring-shaped depressed portions being disposed substantially concentrically in a surface of the sample holder; a first opening located in a first depressed portion, which is the circumferentially outermost one of the plurality of ring-shaped depressed portions, to introduce a gas for heat transfer therethrough; and a second opening located in a second depressed portion, which is internal of the circumferentially outermost depressed portion, to allow the gas in the depressed portion to flow out therethrough.

The foregoing objects are also attained by the constitution in which the number of the regions resulting from the partitioning is 3 or more and by the constitution in which the second region is substantially evacuated.

The foregoing objects are also attained by the constitution in which the number of the depressed portions is 2 or more and by the constitution in which the second depressed portion is substantially evacuated.

The foregoing objects are also attained by the plasma processing apparatus further comprising: a plurality of paths each extending through an inside of the sample holder, the plurality of paths being disposed in inner (or central) portions and outer peripheral portions of inside of the sample holder, respectively, to allow refrigerants adjusted to different temperatures to flow therethrough.

DESCRIPTION OF THE PREFERRED EMBODIMENTS

FIGS. 1, 2, 5, and 6 show a first embodiment of the present invention.

Figure 1:
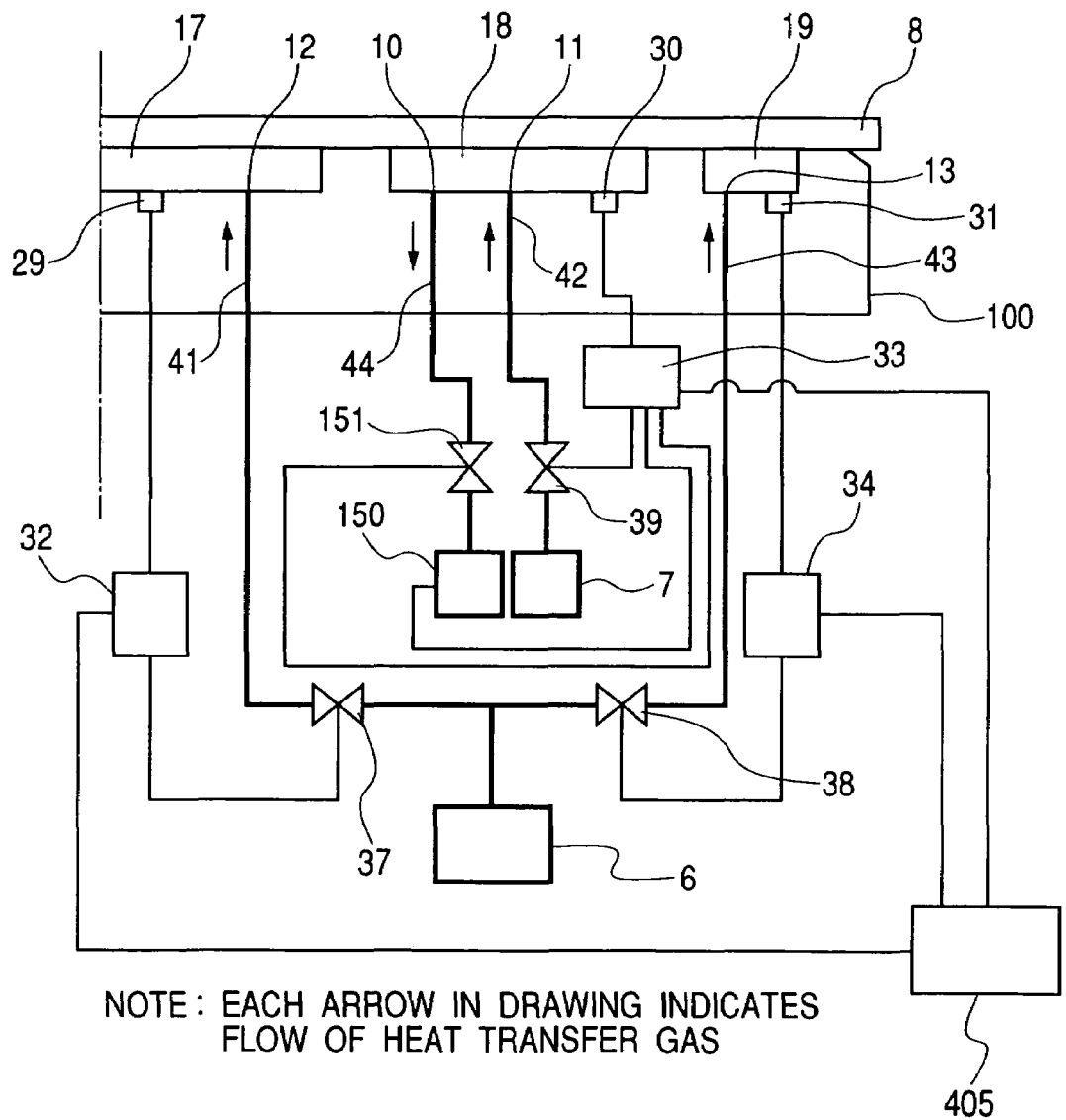
FIG. 1 is a diagram schematically showing a structure of respective circulation paths for a gas and a refrigerant supplied to a sample holder shown in FIG. 5, according to a first embodiment of the present invention.
Figure 2:
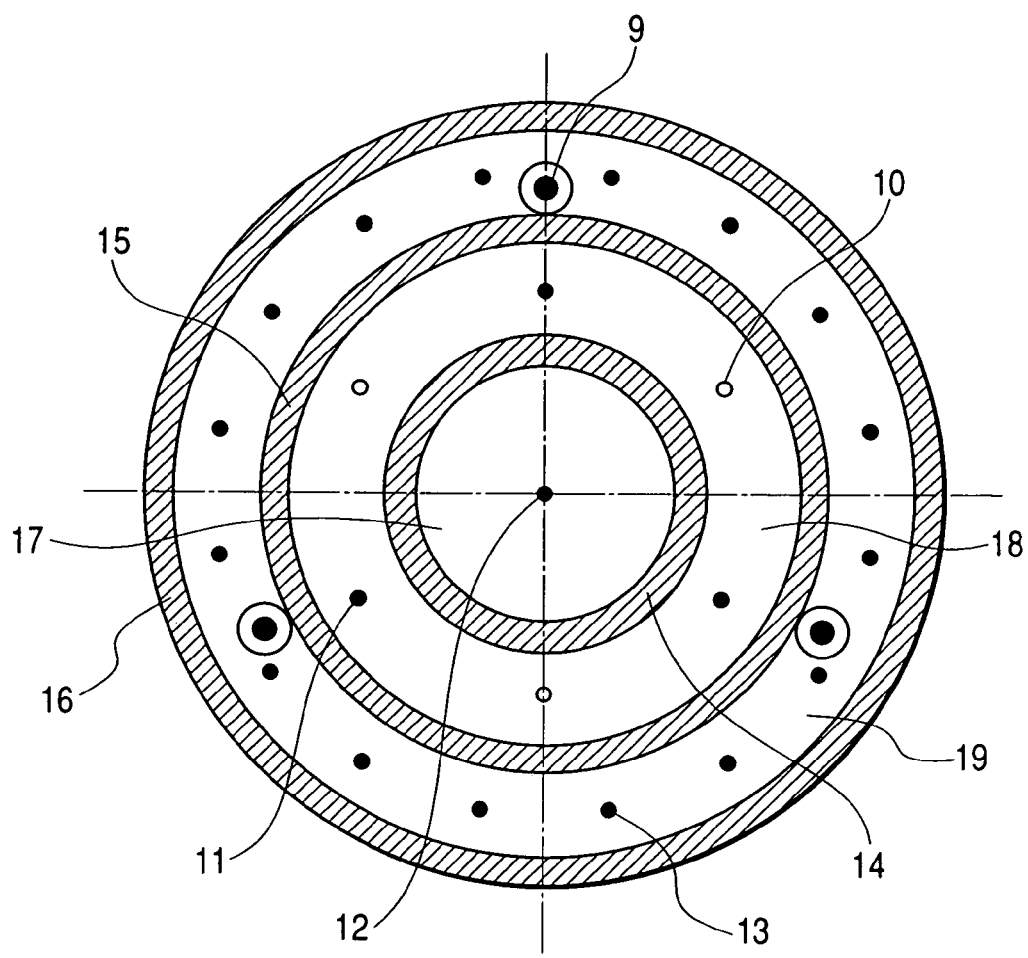
FIG. 2 is a top view showing the configuration of the surface of the sample holder shown in FIG. 5 on which a sample is placed.
Figure 5:
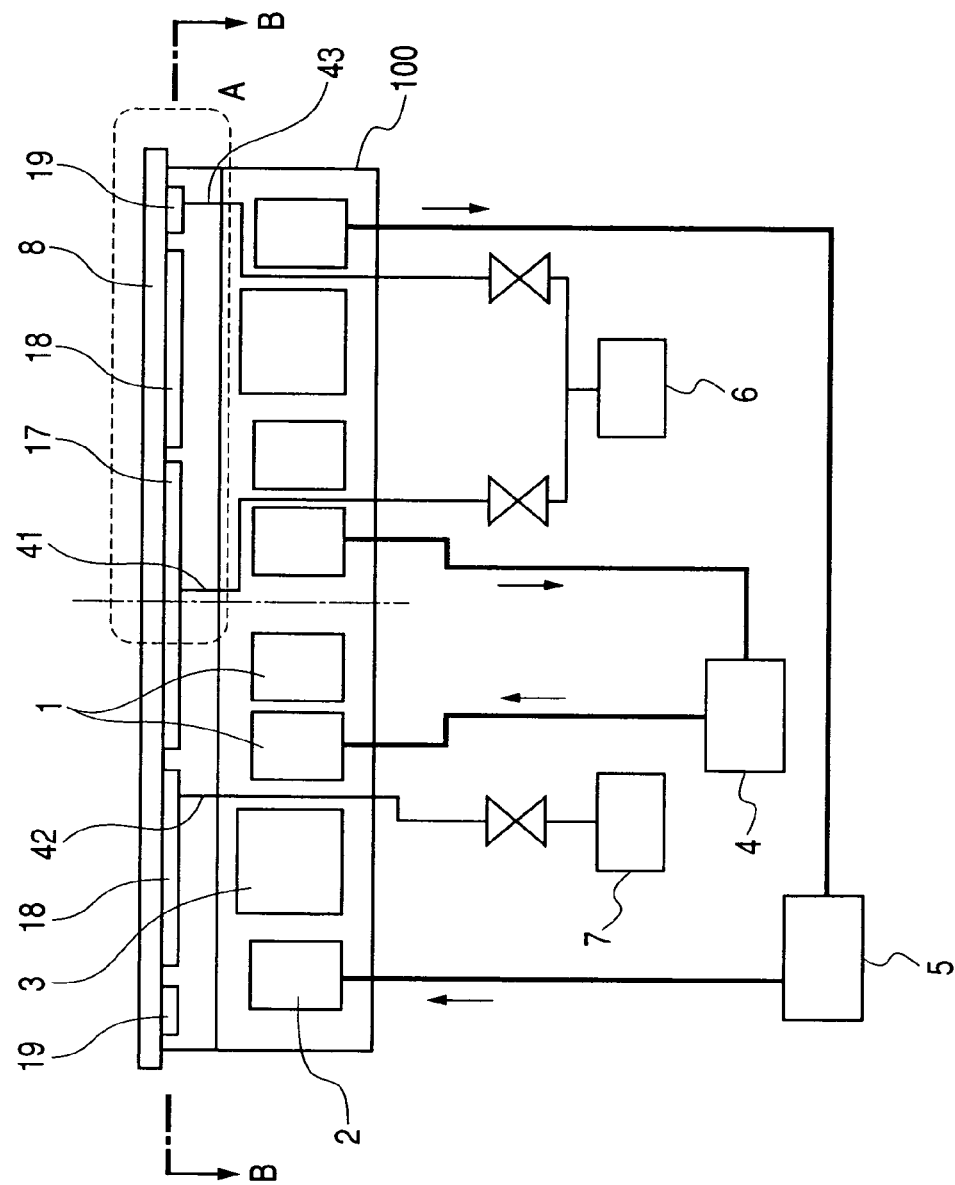
FIG. 5 is a vertical cross-sectional view schematically showing under magnification the structure of a sample holder used in the plasma processing apparatus shown in FIG. 6.
Figure 6:
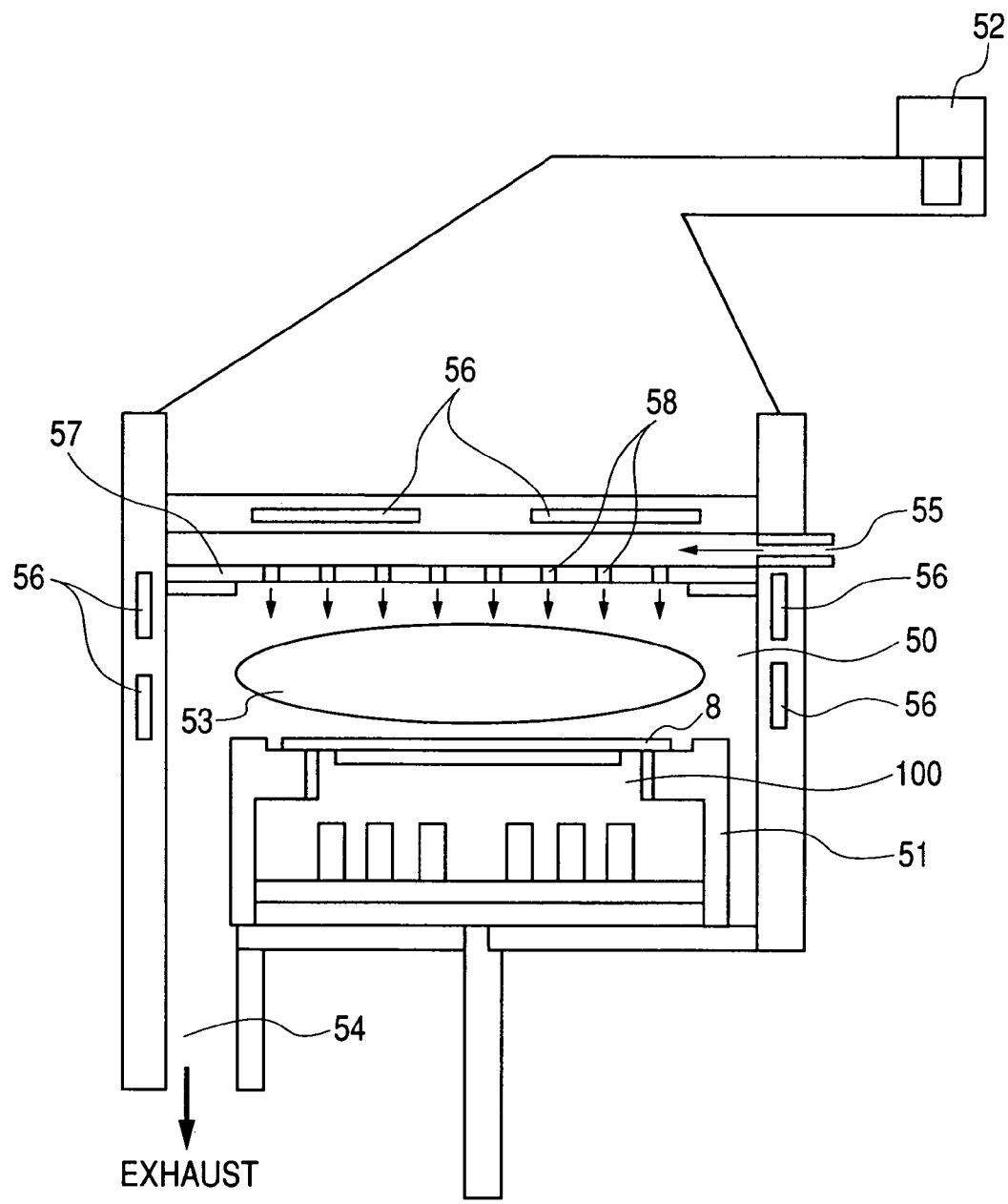
FIG. 6 is a vertical cross-sectional view schematically showing the structure of a processing chamber in a plasma processing apparatus according to a first embodiment of the present invention.

FIG. 6 is a vertical cross-sectional view schematically showing a structure of a processing chamber in a plasma processing apparatus according to the first embodiment. FIG. 5 is a vertical cross-sectional view schematically showing under magnification a structure of a sample holder used in the plasma processing apparatus shown in FIG. 6. FIG. 1 is a diagram schematically showing a structure of respective circulation paths for a gas and a refrigerant supplied to the sample holder shown in FIG. 5. FIG. 2 is a top view showing the configuration of the surface of the sample holder on which a sample is placed.

In FIG. 6, an overall processing chamber 200 has a stage 51 including a sample holder 100 on which a sample to be processed 8 is placed inside a processing chamber 50. In the processing chamber 50, a processing gas is supplied from a processing gas inlet port 55 formed in the wall of the processing chamber 50 into an upper portion of the processing chamber 50 located above a plate-like member 57 disposed over the sample 8. The gas for processing is supplied dispersively from a plurality of through holes 58 opened in the plate-like member (hereinafter referred to as the dispersion plate) 57 into the processing chamber 50 to reach the sample 8 from thereabove.

An electromagnetic wave source 52 emits an electromagnetic wave to the gas supplied into the processing chamber 50 to generate a plasma 53. The electromagnetic wave from the electromagnetic wave source 52 propagates a waveguide tube to be emitted into the processing chamber. In the embodiment shown in the drawing, the electromagnetic wave source 52 emits a microwave or an electromagnetic wave in the UHF band. Three coils 56 are disposed around a space inside the processing chamber 50 located above the sample holder 100 in which the plasma 53 is formed. The distribution of the plasma density in the processing chamber is adjusted with a magnetic field supplied from the coils 56 into the space.

Such electromagnetic wave emitting means and magnetic field supplying means bring the processing gas supplied into the processing chamber 50 into a high energy state so that the plasma 53 is formed in the space located above the sample 8 and diffused in the processing chamber 50 enclosed by the sidewalls thereof. The sample 8 is processed through the reaction between ions and high energy particles in the plasma 53 thus formed and the surface of the sample 8. Products formed through the reactions of the sample 8, the dispersion plate 57, and the members of the sidewalls of the processing chamber 50 with the particles in the plasma 53 during the processing of the sample 8 are exhausted, together with the particles in the plasma 53 which have not contributed to the reactions or the processing of the sample 8, through an exhaust port 54 located below the stage 51 or the sample holder 100 by the operation of a vacuum pump (not shown) coupled to the exhaust port 54.

In the sample holder 100, a plurality of passages for the flow of a refrigerant for the adjustment of the temperature of the sample holder 100 are disposed. There are also disposed a plurality of openings from which a gas for effecting heat transfer between the back surface of the sample 8, i.e., the surface which comes in contact with the sample holder 100 and the surface of the sample holder 100 and a plurality of gas passages connecting to the openings to allow the gas for heat transfer to flow therethrough.

Figure 4:
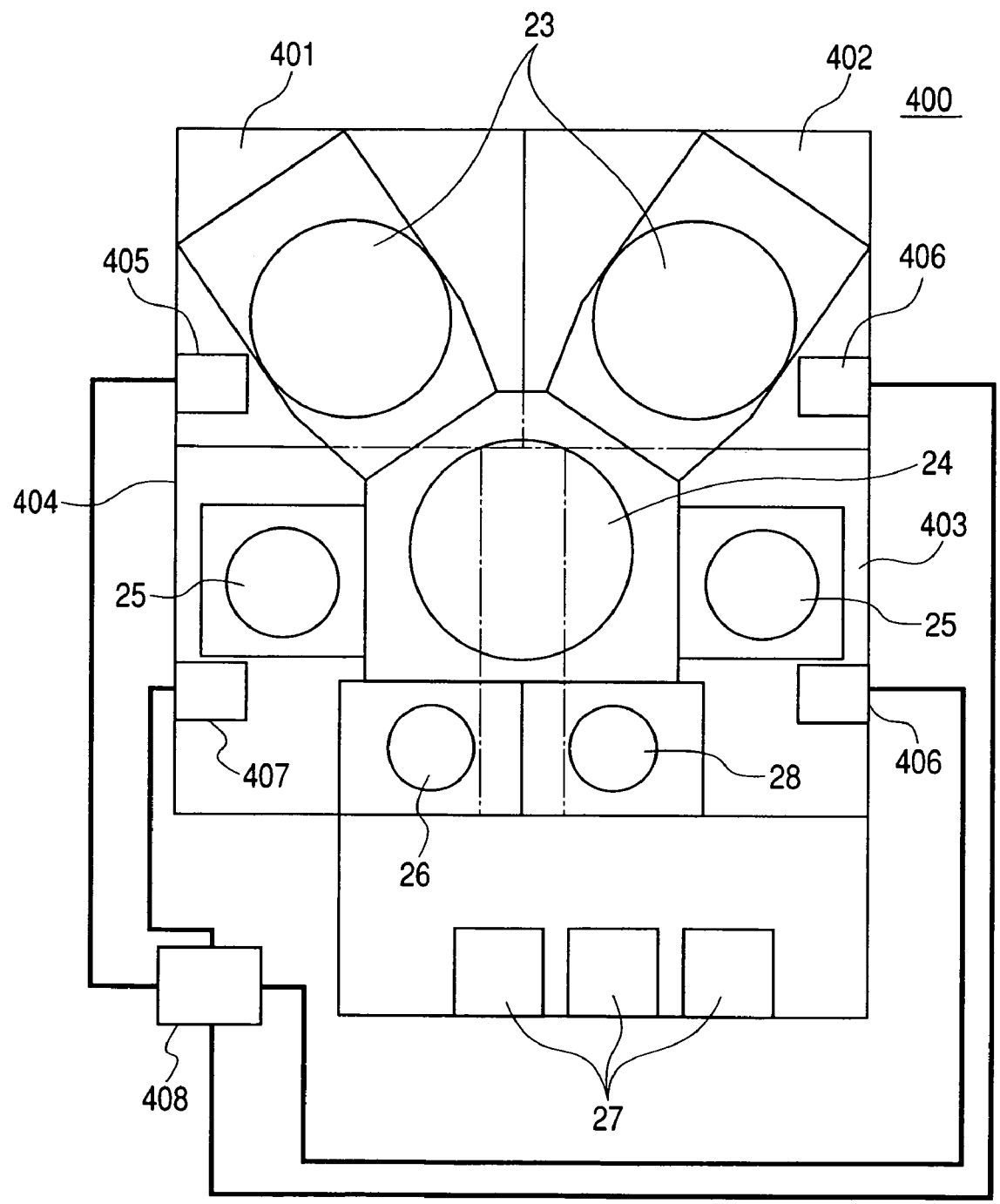
FIG. 4 is a top view schematically showing the structure of a plasma processing apparatus having a processing chamber 50 shown in FIG. 6.

FIG. 4 shows the embodiment of the plasma processing apparatus having the processing chamber 50 shown in FIG. 6. A plasma processing apparatus 400 shown in the embodiment is broadly divided into two parts. In the upper part of the drawing, a processing block in which the processing chamber 50 is provided and processing is performed is disposed, while an atmospheric block which transports the sample under a substantially atmospheric pressure between itself and the processing block is disposed in the lower part of the drawing.

A plurality of cassettes 27 containing therein the sample 8 and a dummy wafer used for cleaning or the like are mounted in the atmospheric block. The atmospheric block transports the sample 8 and the dummy wafer between the cassettes 27 and the processing block, which will be described later, by using a robot arm for transportation (not shown).

In the processing block, there are disposed units 23 and 25 for processing, a unit 24 for transportation capable of sealing the sample 8 and transporting it under a reduced pressure, and lock chambers 26 and 28 in which the pre-processing or post-processing sample 8 is placed under a pressure reduced to a level equal to the pressure in the unit 24 for transportation or increased to a substantially atmospheric pressure to be fed into the processing block and retrieved from the atmospheric block. In the present embodiment, one of the lock chambers 26 and 28 may be dedicated to the feeding of the sample 8 into the processing block (for loading) and the other of the lock chambers 26 and 28 may be dedicated to the retrieval of the sample 8 (for unloading) from the processing block or, if necessary, each of the lock chambers 26 and 28 may be used for both loading and unloading purposes.

Each of the processing units 23 and 25 comprises the processing chamber 50 and includes a plurality of units. In particular, the processing chamber of the unit 23 is for an etching process. The processing chamber of the unit 25 is for an ashing process. Each of the processing units 23 and 25 is broadly divided into upper and lower parts and has a processing chamber portion containing the processing chamber 50 and bed portions 401, 402, 403, and 404 containing utilities needed by the processing chamber portion, such as a power source, reserving portions for the refrigerant and gas, and a pump, which are disposed under the processing chamber portion. These processing units have the processing chamber portions removably attached to the transportation unit 24 and also have the bed portions 401 to 404 removably attached to the main body 400 of the apparatus. The placements and types of the units are changeable depending on the required specifications, while the operations of attaching and detaching the units can be performed in a time shorter than in the conventional apparatus. By reducing the non-operating time of the apparatus resulting from these operations, the operating efficiency of the apparatus can be improved.

In the foregoing processing units, unit control devices 405, 406, 407, and 408 for adjusting the respective processing operations are disposed. A typical one of these unit control devices has a microcomputer and transmits a signal for directing a sensor to output or operate between itself and the processing unit. A main control device 409 for monitoring and adjusting the overall operation of the main body 400 of the apparatus is connected to each of the unit control devices 405 to 408 with or without wires to similarly transmit a signal for instructing the sensor to output or operate such that the operations of the processing units are monitored and adjusted via the unit control devices 405 to 408. It will easily be appreciated that control devices for adjusting the operations of the atmospheric block, the transportation unit 24, and the lock chamber 26 and 28 may also be provided such that they are connected to the main control unit 409 to be monitored and adjusted thereby in the same manner as described above.

FIG. 5 is a vertical cross-sectional view showing in greater detail the structure of the sample holder 100 shown in FIG. 6. In the drawing, a first refrigerant flow path 1 is disposed closer to the center of the sample holder 100, while a second refrigerant flow path 2 is disposed closer to the outer periphery thereof. These refrigerant flow paths 1 and 2 have been disposed to adjust the temperature of the surface of a generally cylindrical sample holder 100 on which the sample 8 is placed to provide a proper temperature distribution across the surface of the sample holder 100. In the present embodiment, the sample 8 is a semiconductor substrate having a generally disk-shaped configuration. To suppress differences in surface configuration resulting from the process performed with respect to the surface of the sample 8 and in the degree to which the surface is processed, each of the refrigerant flow paths 1 and 2 is disposed in an arcuate configuration to allow the setting of a plurality of desired temperatures in the radial directions of the sample 8 or the sample holder 100 and the setting of the substantially same temperature in the circumferential direction thereof. For example, each of the refrigerant flow paths 1 and 2 has a helical or circumferential configuration.

In the present embodiment, the first refrigerant flow path 1 is provided with an opening through which a refrigerant that has flown from the supply side of a temperature adjuster 4 using a freezing cycle, a heat exchanger, or the like through a specified passage flows in. The other end of the refrigerant flow path 1 opposite to the inlet opening relative to the center of the sample holder 100 is provided with an outlet opening through which the refrigerant that has flown through the refrigerant flow path 1 flows out. From the outlet opening, the refrigerant flows through a return path to the recovery side of the temperature adjuster 4. Likewise, the second refrigerant flow path 2 is provided with an opening through which the refrigerant that has flown from the supply side of a temperature adjuster 5 through a specified supply path flows in. The other end of the refrigerant flow path 2 opposite to the inlet opening is provided with an opening from which the refrigerant that has flown through the refrigerant flow path 2 flows out. From the outlet opening, the refrigerant flows through a return path to the recovery side of the temperature adjuster 5.

Thus, the refrigerants flowing in the sample holder 100 circulates through flow channels including the refrigerant flow paths 1 and 2 and the temperature adjusters 4 and 5, respectively.

An atmospheric heat insulating layer 3 is further provided between the first and second refrigerant flow paths 1 and 2 for the purpose of reducing temperature exchanges between the first and second refrigerant flow paths 1 and 2 and the respective portions of the sample holder 100 having temperatures adjusted by the first and second refrigerant flow paths 1 and 2 and thereby reducing a burden on each of the temperature adjusters 4 and 5. In the present embodiment, the refrigerant flow path 1 is provided at a position 0 to 115 mm radially apart from the center of the sample holder 100, while the refrigerant flow path 2 is provided at a position 130 to 150 mm radially apart from the center of the sample holder 100. The atmospheric heat insulating layer 3 is provided at a position 115 to 130 mm radially apart from the center thereof.

The refrigerant for the first refrigerant flow path having a temperature adjusted by the temperature adjuster 4 is introduced from the flow channel into the first refrigerant flow path 1 through the opening disposed therein and flows through the first refrigerant flow path 1, while performing heat exchange with the member closer to the center of the sample holder 100 to adjust the member to a first predetermined temperature. The refrigerant that has flown out of the first refrigerant flow path 1 through the outlet opening passes through the flow channel to return to the temperature adjuster 4. After it is adjusted to a predetermined temperature by the temperature adjuster 4, the refrigerant is introduced again into the first refrigerant flow path 1 via the flow channel. The refrigerant for the second refrigerant flow path having a temperature adjusted by the temperature adjuster 5 is introduced from the flow channel into the second refrigerant flow path 2 through the opening disposed therein and flows through the second refrigerant flow path 2, while performing heat exchange with the member closer to the outer periphery of the sample holder 100 to adjust the member to a second predetermined temperature. The refrigerant that has flown out of the second refrigerant flow path 2 through the outlet opening passes through the flow channel to return to the temperature adjuster 5. After it is adjusted to a predetermined temperature by the temperature adjuster 5, the refrigerant is introduced again into the second refrigerant flow path 2 via the flow channel.

Thus, the refrigerants introduced in the sample holder 100 circulate in the flow channels in which they pass through the specified sections, while having the respective temperatures changed by the temperature adjusters 4 and 5, to be introduced again into the sample holder 100. The temperature difference produced at this time between the two refrigerants forms a temperature distribution across the surface of the sample 8.

The surface of the sample holder 100 is provided with three regions disposed as regions to each of which a gas, such as He, for performing heat transfer between the sample holder 8 and the sample holder 100 is supplied. In the present embodiment, heat transfer gases are supplied via gas supply paths 41, 42, and 43, respectively. The heat transfer gas is supplied from a heat transfer gas bottle 6, which is a reserving portion for the heat transfer gas, to a first heat transfer gas region 17 via the flow path 41. The heat transfer gas is supplied from a gas bottle 7, which is a reserving portion for the heat transfer gas, to a second heat transfer gas region 18 via the flow path 42. The heat transfer gas is supplied from the gas bottle 6 to a third heat transfer gas region 19 via the flow path 43.

When viewed from above the sample holder 100, the first heat transfer gas region has a generally circular configuration, while each of the second and third heat transfer gas regions has a generally circular or ring-shaped configuration. One of the second and third heat transfer gas regions 2 and 3 is positioned inside the other to be disposed in a substantially concentric configuration. In the present embodiment, the first heat transfer gas region 17 is disposed radially in a range of 0 to 75 mm from the center of the sample holder 100, the second heat transfer gas region 18 is disposed radially in a range of 75 to 135 mm, and the third heat transfer gas region 19 is disposed radially in a range of 135 to 150 mm.

FIG. 2 shows the surface configuration of the sample holder 100 to which such heat transfer gasses are supplied. In the drawing, three projecting portions 14, 15, and 16 each having a circumferential configurations are disposed substantially concentrically on the surface of the sample holder 100. Each of these projecting portions has an upper surface formed with an extremely small width. A film made of a dielectric material formed by coating, spraying, or the like is disposed on the surface of the projecting portion. The dielectric material is charged with a voltage applied to an electrode disposed in the sample holder 100 to generate a pressing force under which the sample 8 is brought into contact with the projecting portions and adsorbed thereby, which will be described later.

The sample 8 placed on the sample holder 100 or the stage 51 having a predetermined temperature is adsorbed and held by static electricity. This brings the sample 8 placed above the sample holder 100 into contact with the upper surfaces of the projecting portions 14, 15, and 16 and defines the three regions to which the foregoing heat transfer gases are supplied so that the space between the sample 8 and the depressions formed in the surface of the sample holder 100 forms the foregoing heat transfer gas regions. That is, the foregoing projecting portions 14, 15, and 16 are for substantially hermetically sealing the heat transfer regions 17, 18, and 19, respectively, while the surface of the sample holder 100 serves as a member for performing substantially hermetical sealing. Specifically, the sample 8 has the outer peripheral portion thereof adsorbed by static electricity (hereinafter referred to as electrostatic adsorption) in such a manner that the leakage of the He gas from the outer peripheral portion is suppressed, while the center portion of the sample 8 is partially adsorbed in such a manner that the floating of the center portion under the pressure of the transfer gas is suppressed.

A large number of extremely small protrusions are formed on the surface of the sample holder 100 to be located between the foregoing projecting portions 14, 15, and 16, though they are not depicted. These protrusions come in contact with the back surface of the sample 8 at an extremely small area and thereby support the sample 8 on the surface of the sample holder 100. In particular, the contact achieved between the protrusions including the projecting portions 14, 15, and 16 and the sample 8 at an extremely small area reduces an amount of a foreign substance, such as waste or a reaction product, which is exchanged between the surface of the sample holder 100 and the back side of the sample 8 to disturb the process and elongates a period till the apparatus halts and becomes non-operative or reduces a non-operative period, thereby improving the operating efficiency of the apparatus and the yield rate of the process.

Figure 3:
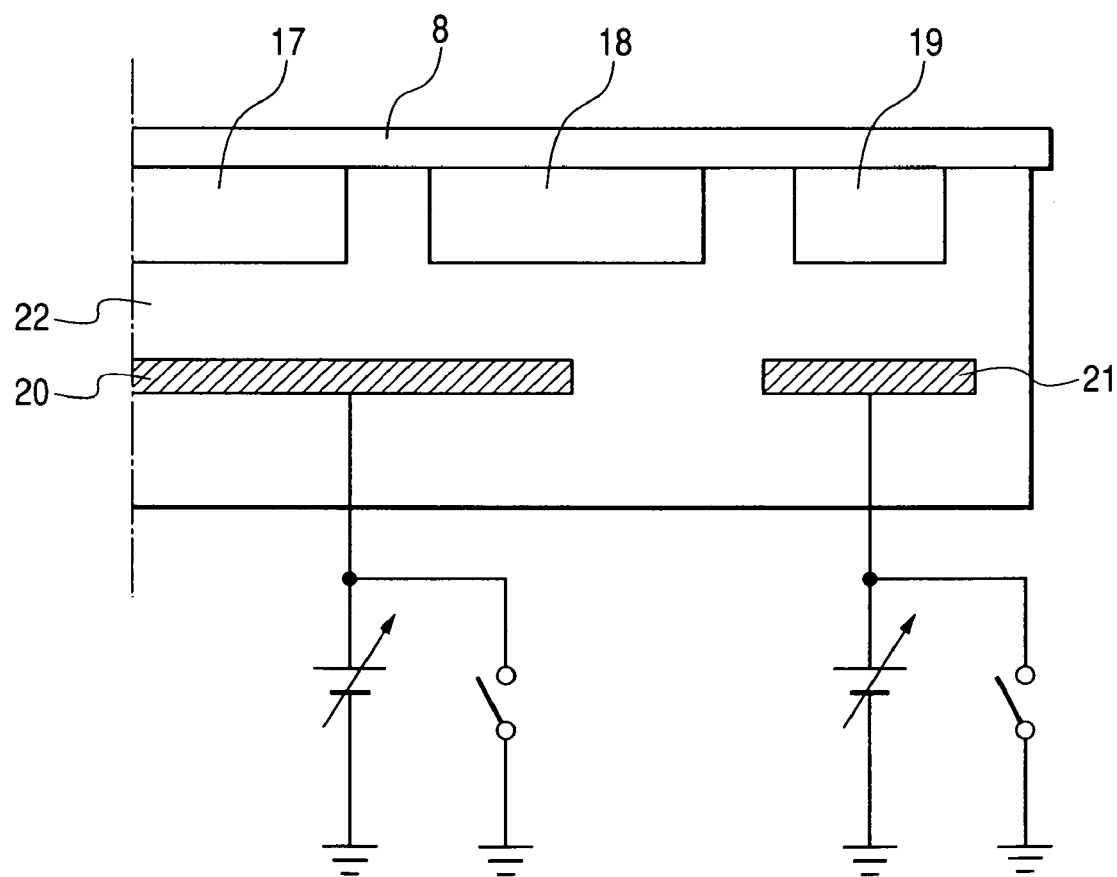
FIG. 3 is a vertical cross-sectional view schematically showing a structure for performing electrostatic adsorption on the sample holder shown in FIG. 5.

FIG. 3 schematically shows a structure for performing electrostatic adsorption in the present embodiment. In the drawing, potentials of different polarities are imparted to conductive plates 20 and 21, respectively. This induces charges of different polarities across the surface of the sample 8 to be adsorbed by the surface of the sample holder 100 and generates an adsorbing force under static electricity in a direction which presses the sample 8 against the surface on the sample holder 100, so that the sample 8 is held on the surface of the sample holder 100. To remove (discharge) the static electricity which generates the adsorbing force, potentials of polarities opposite to those of the potentials applied previously to the conductive plates 20 and 21 are applied thereto.

Consequently, charges opposite to the charges induced by the adsorption move in such as manner that neutralization occurs therebetween and charging is removed. As a result, the pin of a sample raising mechanism denoted by 9 in FIG. 2 is operated upward to raise the sample 8 above the sample holder 100 and transported out of the processing chamber 50 by the robot arm disposed in the transportation unit 24. The foregoing structure prevents a situation in which the sample 8 remains in a charged state with residual charges and, even when the sample 8 is to be removed from the sample holder 100, it cannot be removed for a long period of time due to the remaining adsorbing force acting on the sample 8 or the sample is deformed and damaged, thereby allowing the process to be performed with respect to another sample and improving the operating efficiency of the apparatus.

FIG. 1 shows a structure for supplying the heat transfer gasses to the three regions. In the drawing, the heat transfer gas emitted from the gas bottle 6 is introduced into the flow path 41 disposed between the gas bottle 6 and the first heat transfer gas region and connecting the gas bottle 6 and the first heat transfer gas region to each other. After having a pressure adjusted by a pressure adjusting valve 37 disposed above the flow path 41, the heat transfer gas flows into the first heat transfer gas region 17 through an opening 12 located above the sample holder 100 in facing relation to the first heat transfer gas region 17.

The heat transfer gas is filled in the first heat transfer region 17 and transfers heat between the portion of the sample holder 100 closer to the center thereof and the portion of the sample placed thereabove which is closer to the center thereof. Thereafter, a part of the first heat transfer gas introduced into a heat transfer gas path leaks beyond the projecting portion 14 disposed on the surface of the sample holder to flow into the second heat transfer region 18. The projecting portion 14 may also be provided with a specified connection path connecting the first and second heat transfer regions 17 and 18 to allow easy flowing of the heat transfer gas into the region 18. Consequently, the pressure of the heat transfer gas in the first heat transfer gas region 17 is adjusted to a predetermined value, while gas introduction is performed by an adjusting valve 37 including a pressure detector attached in an intervening manner to the flow path connecting the first heat transfer gas region 17 and the gas bottle 6 to each other.

Specifically, a temperature sensor 29 for sensing the temperature of the first heat transfer gas region 17 is provided in facing relation thereto or in the sample holder 100 in proximity to the first heat transfer gas region 17. A pressure adjuster 32 which receives an output from the temperature sensor 29 gives an instruction to the pressure adjusting valve 37 in response to the output from a temperature sensor 29 and thereby drives it. If the difference between the output sensed by the temperature sensor 29 and a predetermined value is equal to or larger than a specified value, the pressure adjuster 32 having an arithmetic operation unit such as a microcomputer determines an amount of required pressure variation by an arithmetic operation and gives an instruction to the pressure adjusting valve 37 to adjust the operation of the valve. Thus, the temperature sensed by the temperature sensor 29 is outputted to be feedbacked to the adjustment of the operation of the pressure adjusting valve 37.

Likewise, the heat transfer gas emitted from the gas bottle 6 is introduced into the flow path 43 disposed between the gas bottle 6 and the third heat transfer gas region 19 and connecting the gas bottle 6 and the third heat transfer gas region 19 to each other. After having a pressure adjusted by a pressure adjusting valve 38 disposed above the flow path 43, the heat transfer gas flows into the third heat transfer gas region 19 through an opening 13 located above the sample holder 100 in facing relation to the third heat transfer gas region 19.

The heat transfer gas is filled in the third heat transfer region 19 and transfers heat between the portion of the sample holder 100 closer to the outer periphery thereof and the portion of the sample 8 placed thereabove which is closer to the outer periphery thereof. Thereafter, a part of the heat transfer gas introduced into the third heat transfer gas region 19 leaks beyond the projecting portion 16 disposed on the surface of the sample holder to the outside of the sample holder 100 from the outer periphery thereof. Another part of the heat transfer gas introduced into the third heat transfer gas region 19 leaks beyond the projecting portion 15 disposed on the surface of the sample holder to flow in the second heat transfer region 18. The projecting portion 15 may be provided with a specified connection path connecting the second and third heat transfer regions 18 and 19 to allow easy flowing of the heat transfer gas into the region 18. Consequently, the pressure of the heat transfer gas in the third heat transfer gas region 19 is adjusted to a predetermined value, while gas introduction is performed by the adjusting valve 38 including a pressure detector attached in an intervening manner to the flow path connecting the third heat transfer gas region 19 and the gas bottle 6 to each other.

Specifically, the temperature sensor 31 for sensing the temperature of the third heat transfer gas region 19 is provided in facing relation thereto or in the sample holder 100 in proximity to the third heat transfer gas region 19. The pressure adjuster 34 which receives an output from a temperature sensor 31 gives an instruction to the pressure adjusting valve 38 in response to the output from the temperature sensor 31 and thereby drives it. If the difference between the output sensed by the temperature sensor 31 and a predetermined value is equal to or larger than a specified value, the pressure adjuster 34 having an arithmetic operation unit such as a microcomputer determines an amount of required pressure variation by an arithmetic operation and gives an instruction to the pressure adjusting valve 38 to adjust the operation of the valve. Thus, the temperature sensed by the temperature sensor 31 is outputted to be feedbacked to the adjustment of the operation of the pressure adjusting valve 38.

The heat transfer gas emitted from the gas bottle 7 toward the second heat transfer region 18 is introduced into the flow path 42. After having a pressure adjusted by a pressure adjusting valve 39 disposed above the flow path, the heat transfer gas flows into the second heat transfer gas region 18 through an opening 11 located above the sample holder 100 in facing relation to the region. The heat transfer gas is filled in the second heat transfer region 18 and transfers heat between the portion of the sample holder 100 interposed between the first and third heat transfer regions 17 and 19 and the portion of the sample 8 placed thereabove which is closer to the outer periphery thereof. In the second heat transfer region 18, an opening 10 is further provided in the portion of the sample holder 100 facing the region. The gas in the region is exhausted by the operation of an exhaust pump 150 for heat transfer gas through a flow path 44 connected to the exhaust pump 150 for heat transfer gas via the opening 10 and an exhaust adjusting valve 151.

In the same manner as in the case of each of the first and third heat transfer regions, the pressure of the heat transfer gas in the second heat transfer gas region 18 is adjusted to a predetermined value, while it is introduced into the second heat transfer region 18 by the operations of the adjusting valve 39 including a pressure detector attached in an intervening manner to the flow path connecting the region and the gas bottle 7 to each other and of an exhaust valve 151. In the present embodiment, a temperature sensor 30 for sensing the temperature of the second heat transfer gas region 18 is provided in facing relation thereto or in the sample holder 100 in proximity to the second heat transfer gas region 18. A pressure adjuster 34 having an arithmetic operation unit such as a microcomputer receives an output from the temperature sensor 30 for sensing the temperature of the region. The pressure adjuster 38 is adjusted based on an instruction transmitted in response to the received output. The adjustment is performed by feedbacking the temperature sensed and outputted by the temperature sensor 30 to the adjustment of the operation of the pressure adjusting valve 39 in the same manner as in the case of the pressure adjusters 32 and 33. It is also possible to adjust the operation of the exhaust adjusting valve 151 based on the output from the temperature sensor 30 in the same manner as in the case of the pressure adjusting valve 39.

Although only the openings 12 and 13 through which the heat transfer gas is supplied are located in the first and third heat transfer regions 17 and 19 in the foregoing embodiment, each of the first and third heat transfer regions 17 and 19 may also have a flow path with an exhaust pump or an exhaust adjusting valve disposed therein in an intervening manner and an opening for exhaust connecting to the flow path, similarly to the second heat transfer region 18, such that the gas in the region flows out to be exhausted, while the amount and speed of the exhaust is adjusted.

Since the foregoing structure transmits, to the sample 8, the temperature distribution across the sample holder 100 having a member large in volume and mass and a large heat capacity, the present embodiment can realize a desired temperature distribution across the sample 8 by adjusting the temperature distribution across the sample holder 100. By further transmitting the temperature of the surface of the sample 8 by differentiating the amount and speed of heat transfer in the three or more regions which are the region of the sample 8 or the sample holder 100 closer to the center thereof, the region of the sample 8 or the sample holder 100 closer to the outer periphery thereof, and the region therebetween, a temperature distribution desired by the user of the apparatus can be achieved with higher precision.

The heat transfer gases introduced into the sample holder 100 are introduced again into the sample holder 100 after having respective pressures changed by the pressure adjusting valves 37, 38, and 39. By adjusting the pressures of the three heat transfer gases, the temperature distribution across the surface of the sample holder 100 or the sample 8 becomes closer to a desired temperature distribution. In the present embodiment, the pressure of the gas in the second heat transfer gas region 18 is adjusted to be lower than the pressure of the gas in each of the first and third heat transfer regions 17 and 19 such that the heat is less likely to be transferred between the sample 8 and the sample holder 100 in the surface portion of the sample 8 extending radially in the range of 75 to 135 mm, i.e., the heat transfer is suppressed compared with that in the other heat transfer gas regions. This allows the temperature in the range to be higher than in the other regions and thereby realizes a temperature distribution desired by the user of the apparatus.

Each of the pressure adjusters 32, 33, and 34 is connected to the control device 405 for the foregoing units with or without a wire to transmit and receive a signal for instructing the sensor to output or operate. The operation of the sample holder 100 is monitored and adjusted by the control device 405.

Figure 7:
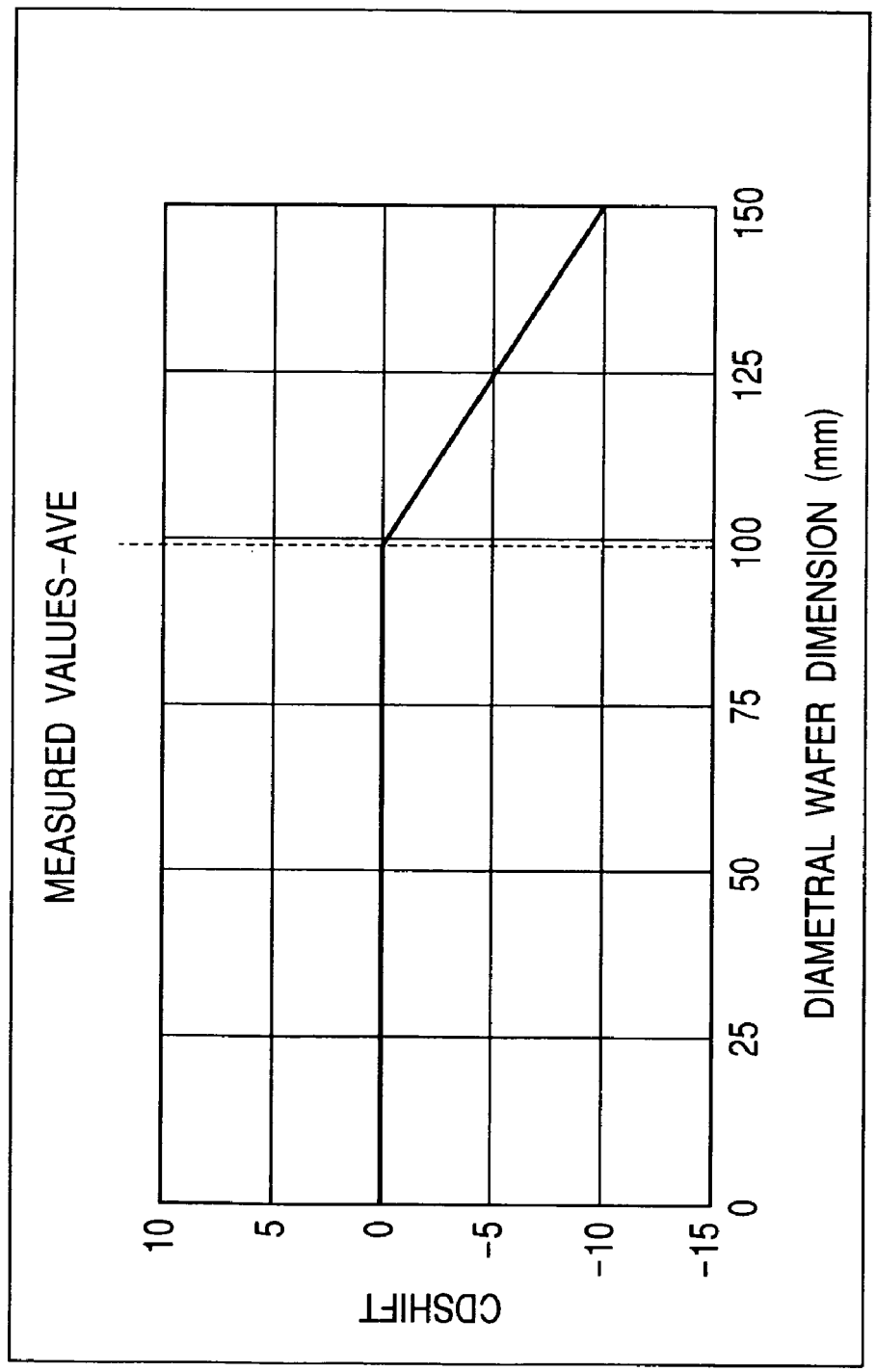
FIG. 7 is a graph showing the distribution of the post-processing configurations of samples.
Figure 8:
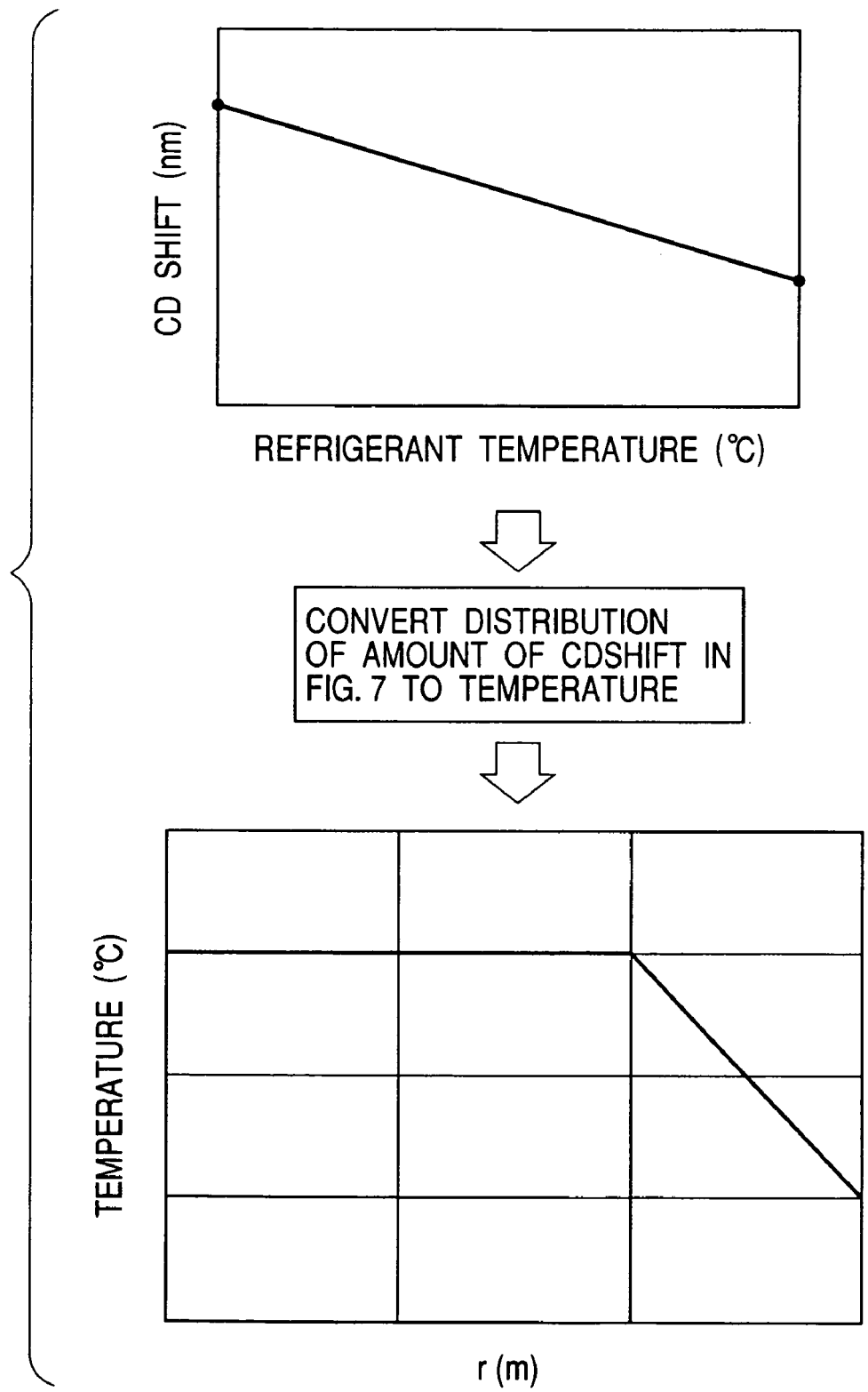
FIG. 8 is a graph showing a relationship between the post-processing configuration of a sample, each of desired temperature of a sample holder and a position on the sample relative to the center thereof, according to the embodiment of the present invention.

In the present embodiment, the temperature distribution across the surface of the sample 8 is derived from the distribution of the post-processing configuration of the sample and from the relationship between the post-processing configuration of the sample and the refrigerant temperature or the temperature of the sample holder, as shown in FIG. 7. Objective (desired) temperature distributions to be achieved in the present embodiment are shown in FIG. 8. In the drawing, the surface temperature of the sample 8 has a distribution such that it is substantially uniform from the center of the sample 8 to a certain radial point thereon and then lowers at positions radially external of the certain radial point, while forming an acute angle at the certain radial point serving as an inflection point, in direct proportion with the magnitude of the radius.

In such a distribution of the surface temperature of the sample 8, the values of the temperatures are determined by the user of the apparatus in accordance with the distribution of reaction products over the surface of the sample 8 which are generated during the plasma process. A description will be given to such a relation by using the graph shown in FIG. 8.

If the reaction products generated in the processing chamber 50 for etching the sample 8 are larger in amount in a region closer to the center of the sample 8 and gradually reduced in amount with approach toward the outer periphery of the sample 8, the surface configuration of the sample 8 being etched is influenced by the amount and density of these reaction products. For example, variations in the amount of CD shifting across the surface of the sample do not present a distribution which is uniform throughout the surface due to such factors as the distribution of the density of the generated plasma and the flow of the vacuum exhaust. In this case, the refrigerant temperature and the pressure of the heat transfer gas may be set properly in the following manner in accordance with the variations in the amount of CD shifting across the surface of the sample. Since it is considered that the sample temperature is higher at a portion with a small mount of CD shifting and therefore the reaction products are less likely to be adhered again thereto, an improvement can be made by adjusting the refrigerant temperature and the pressure of the heat transfer gas to reduce the sample temperature and thereby reducing the differences in CD shifting across the surface of the sample.

Specifically, in a region inside the reaction chamber 50 in which the reaction products are higher in density (larger in amount), the temperature of the sample holder 100 located thereunder is increased to increase the surface temperature of the sample 8 and thereby suppress the re-adhesion of the reaction products to the surface of the sample 8. In a region in which the reaction products are lower in density (smaller in amount), on the other hand, the temperature of the sample holder 100 located thereunder is reduced to adjust the amount of the reaction products adhered to the surface of the sample 8 and thereby bring the speed at which the whole sample is processed closer to uniformity.

Thus, the distribution of the temperature values across the sample 8 and the distribution of the temperature values across the sample holder 100 for adjusting the temperature distribution across the sample 8 are determined in accordance with the distribution of the density of the reaction products. In short, the temperature distribution across the sample holder 100 is determined such that the temperature is higher at the portion thereof closer to the center and gradually lowers with approach toward the outer periphery. FIG. 8 shows an example of the temperature distribution.

It can be considered that the temperature distribution in another process performed with respect to a sample and influenced by the adhesion of reaction products to the sample also has the same tendency as shown in FIG. 8. For example, the temperature inflection point is located more internally when the speed at which the reaction products are exhausted from the processing chamber is higher than in FIG. 8 so that the temperature difference between the center portion and the outermost peripheral portion is increased. Accordingly, the respective positions of the plurality of heat transfer regions to which the heat transfer gases are supplied are varied in the radial direction of the sample or the sample holder in accordance with the characteristic of the temperature distribution. It will easily be understood that the temperature distribution may vary depending on the type of the sample, the speed at which the reaction products are exhausted, or the like. Therefore, the present invention is by no means limited to the distribution of the values and the configuration of the graph shown in FIG. 8.

Figure 10:
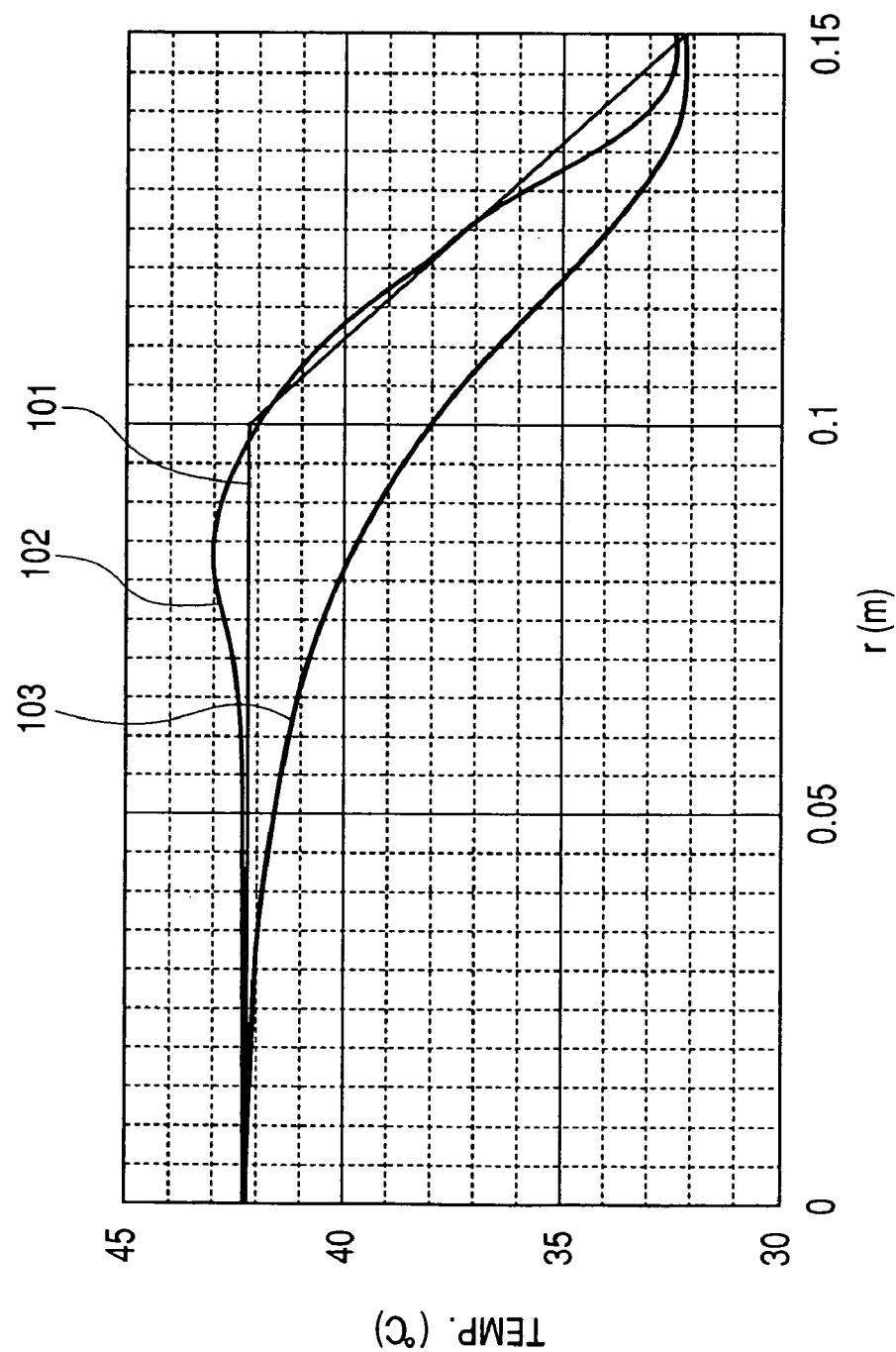
FIG. 10 is a graph showing the distribution of the temperatures of samples obtained according to the embodiment shown in FIG. 5 and the distribution of the temperatures of samples obtained by using the prior art technology.

A description will be given to temperature distributions implemented by using the foregoing structure with reference to FIG. 10. In FIG. 10, the pressure in each of the first and third heat transfer gas regions 17 and 19 is adjusted to, e.g., 1.5 kPa. By contrast, the pressure in the second heat transfer gas region 18 is approximately 0 kPa since the intensity of exhaust from the second heat transfer gas region 18 is high and the speed of exhaust is sufficiently higher than the respective speeds of the gases flown from the first and third heat transfer regions 17 and 19 into the second heat transfer region 18 and of the gas supplied to the second heat transfer region 18 or since no gas is supplied to the region.

However, the pressure in the second heat transfer gas region 18 should be varied responsively to the amount of heat supplied to the region of the sample 8 (heat input) located above the region. If a comparison is made between the respective pressures when the heat input is high and when the heat input is low, the pressure is relatively high when the heat input is high, while the pressure is adjusted to a relatively low level when the heat input is low. If the sample 8 is a semiconductor wafer and gate processing using a semiconductor etching process is performed with respect to the wafer, the heat input is considerably lower than in the step with a high heat input such as the processing of an insulating film, which is about 50 W to 100 W. In this case, a pressure of about 0 to 0.5 kPa is sufficient for the second heat transfer gas region 18.

Thus, the heat transfer gases introduced into the sample holder 100 are introduced again into the sample holder 100 after having respective pressures changed by the pressure adjusting valves 37, 38, and 39. By adjusting the individual pressures of the three heat transfer gases, the temperature distribution across the surface of the sample holder 100 is brought closer to a desired temperature distribution. By particularly adjusting the pressure of the gas in the second heat transfer gas region 18 to be lower than the pressure of the gas in the third heat transfer gas region 19, the heat supplied to the sample in the surface portion of the sample extending radially in the range of 75 to 135 mm is made less likely to be transferred to the sample holder 100. By achieving a higher heat insulating effect than in the other heat transfer gas regions, the temperature in the range becomes higher than in the other regions to be closer to an objective and ideal temperature distribution 101.

In the temperature distribution 103 having the two heat transfer regions, which has been obtained by using the prior art technology, the pressure of the heat transfer gas in the outer circumferential heat transfer region is adjusted to be higher and the pressure in the inner circumferential heat transfer region is adjusted to be lower so that the temperature of the sample is higher in the inner region. The temperature at a middle point in the outer region is influenced and determined by the pressure of the heat transfer gas and by the amount of heat supplied to this region. At the portion 140 mm apart from the center of the sample 8, in particular, the lowest temperature is reached. Likewise, the temperature at a middle point in the region closer to the center (center portion of the sample 8) is determined by the pressure of the supplied heat transfer gas and by the amount of heat supplied to the region closer to the center of the sample.

According to the prior art technology, however, heat shift occurs between the region of the wafer on the heat transfer region closer to the center and the region of the wafer on the heat transfer region closer to the outer periphery so that the temperature variations in the both regions are gradual from the center of the sample 8 to the position closer to the outer periphery at which the lowest temperature is reached. Compared with the objective temperature variation 101, a large difference is produced in the vicinity of a point at a distance of 100 mm from the center of the sample 8 so that a temperature lower than the objective value is provided. In contrast to the prior art technology, the present embodiment has the second heat transfer region in which the pressure of the gas is adjusted to be lower than in each of the heat transfer regions closer to the center and closer to the outer periphery and adjusts the temperature in the second region to be higher, as described above. Consequently, the temperature variation 102 across the sample 8 according to the present embodiment brings the temperatures in the second and third heat transfer regions closer to the objective temperature distribution 101 and allows more uniform processing across the sample 8.

The pressures and flow rates of the heat transfer gases are adjusted by using pressure adjusting valves such that a desired temperature is achieved at a specified position on the surface of the sample 8 by particularly feedbacking the respective temperatures of the heat transfer regions measured by using the temperature sensors to the respective pressure adjusters for the individual regions and thereby adjusting the amount of heat transfer between the sample 8 and the sample holder 100.

Figure 11:
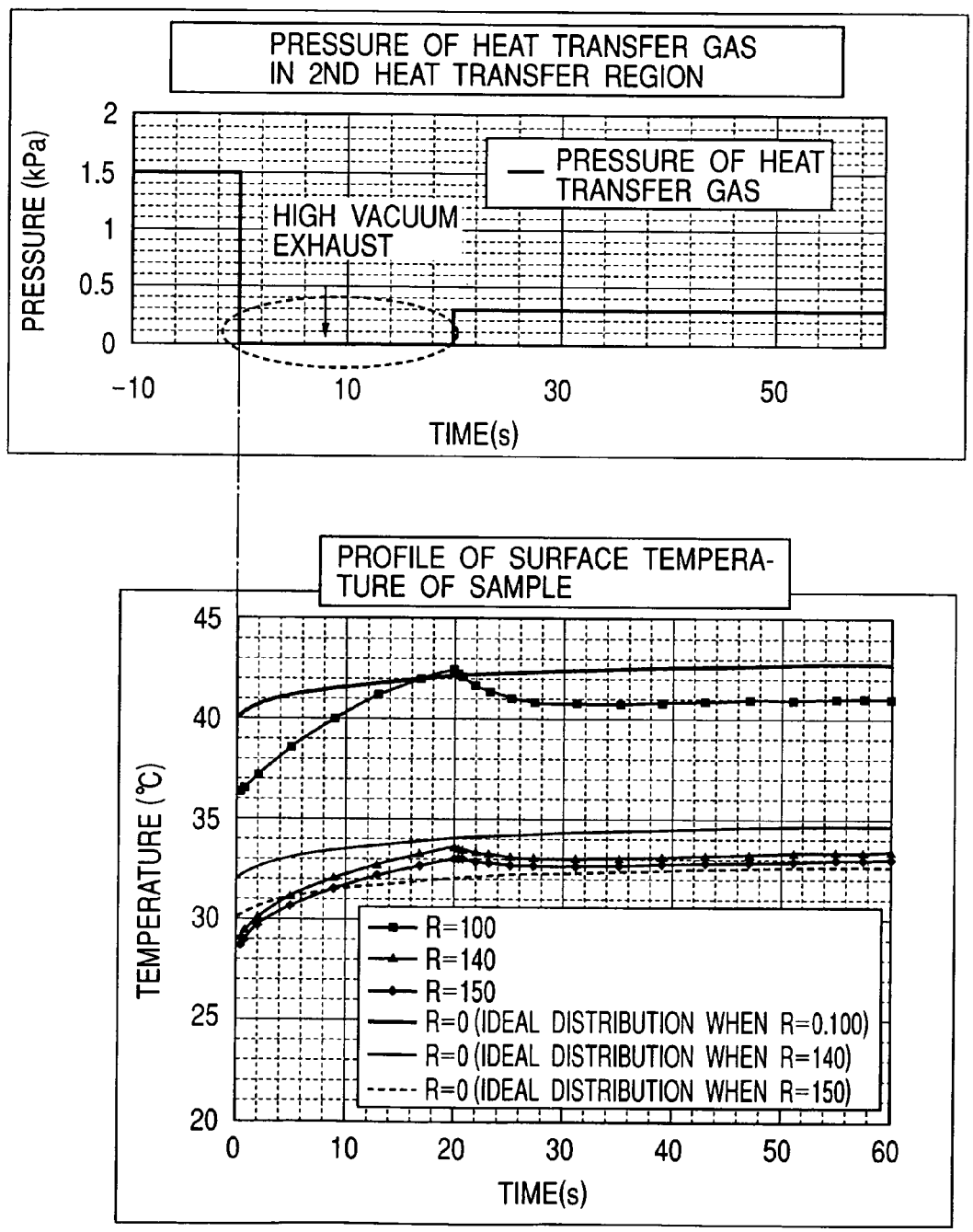
FIG. 11 is a graph showing the time-varying pressure of a heat transfer gas and the time-varying temperature of a sample in a process performed according to the embodiment shown in FIG. 5.
Figure 12:
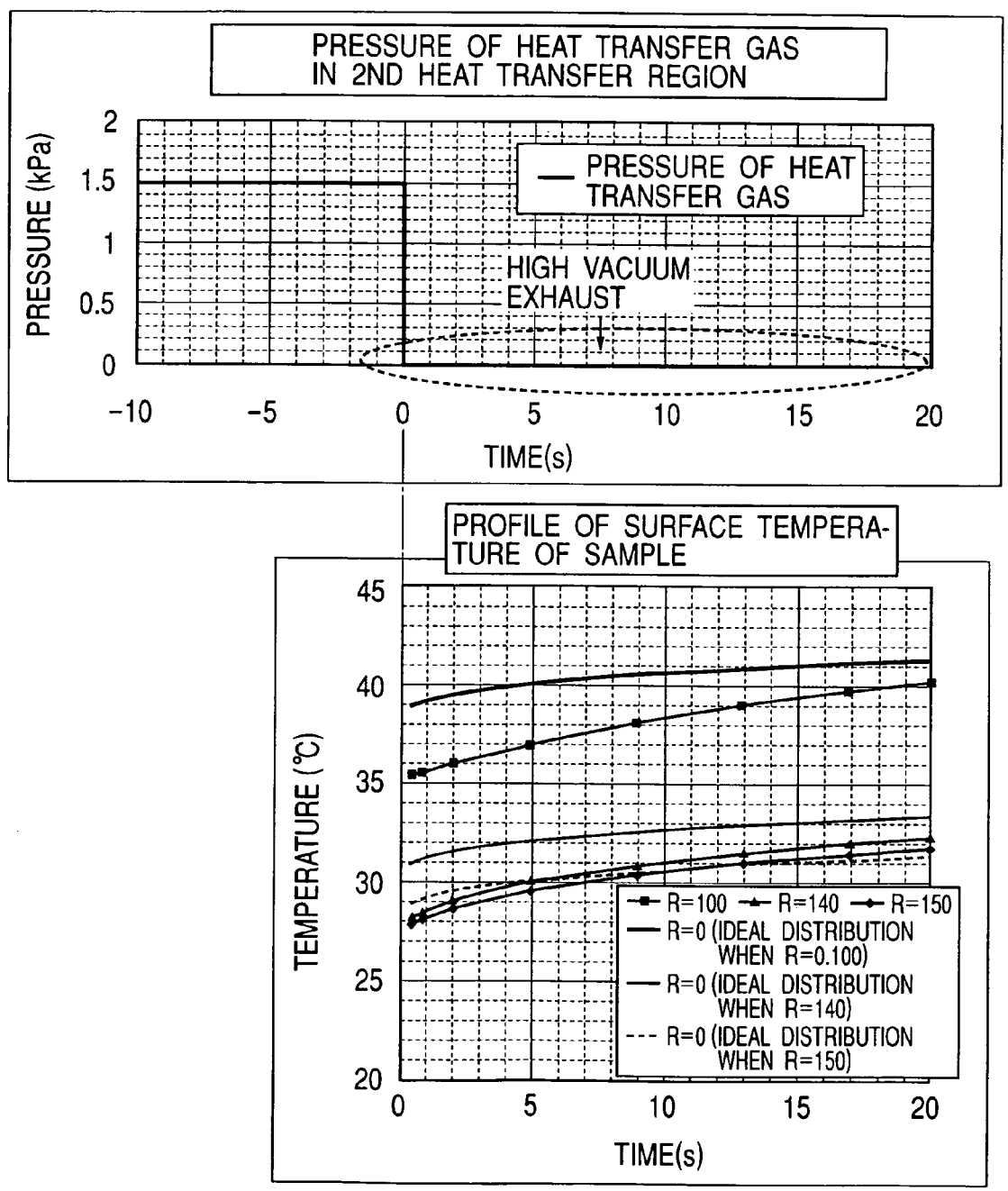
FIG. 12 is a graph showing the time-varying pressure of the heat transfer gas and the time-varying temperature of a sample in the process performed according to the embodiment shown in FIG. 5.
Figure 13:
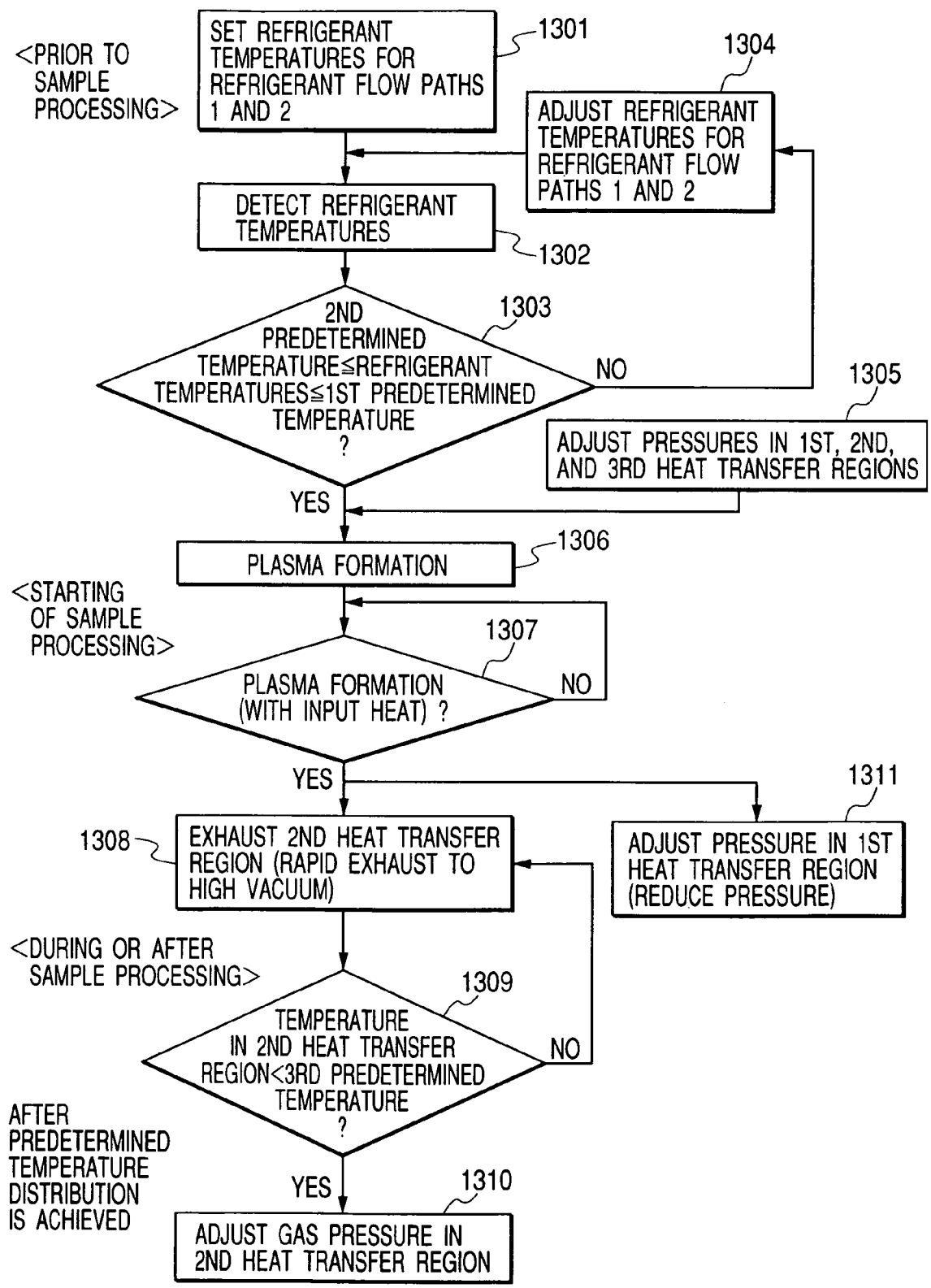
FIG. 13 is a flow chart illustrating the flow of the process shown in FIG. 11.

Referring to FIGS. 11 to 13, a description will be given to the operation of processing a sample according to the present embodiment. FIGS. 11 and 12 are graphs for illustrating a temperature and variations in the pressure of the heat transfer gas in the processing of the sample according to the embodiment shown in FIG. 6. FIG. 13 is a flow chart showing the flow of the operation of the processing according to the present embodiment shown in FIG. 11.

In the present embodiment, the sample holder 100 is internally provided with a plurality of refrigerant flow paths 1 and 2 that can be adjusted to different temperatures. Prior to the processing, the temperature in the refrigerant flow paths 1 and 2 are adjusted and refrigerants are allowed to flow therethrough to adjust the temperature of the sample holder 100 such that the temperature distribution across the surface of the sample holder 100 on which the sample 8 is placed provides a desired temperature distribution across the surface of the sample 8.

The temperature values over the sample holder 100 are determined under consideration such that the temperature of the sample 8 has a proper value when a plasma is generated and heat is supplied. In this case, the respective pressures in the three heat transfer gas regions between the back surface of the sample 8 and the surface of the sample holder 100 on which the sample is placed are selected such that the temperature of the sample holder 100 is reflected more precisely in the sample 8. In the present embodiment, each of the respective pressures in the three heat transfer regions 17, 18, and 19 is set to 1.5 kPa.

If the pressure in the second heat transfer gas region 18 is low prior to the processing of the sample, i.e., when no heat has been inputted, a heat insulating portion is formed thereby and a point at a radial distance of about 75 mm, which corresponds to the terminal end of the first heat transfer gas region 17, becomes a temperature inflection point so that the resulting temperature distribution deviates from a predetermined temperature distribution. If the pressure in the second heat transfer gas region 18 is high, on the other hand, the temperature distribution across the sample holder 100 is reflected so that a point at a radial distance of about 100 mm becomes an inflection point and the resulting temperature distribution is closer to the specified one.

After the sample 8 is placed on the sample holder 100, the processing gas is introduced into the processing chamber 50, while an electromagnetic wave is emitted, so that the plasma 53 is formed in the processing chamber 50. The surface of the sample 8 is processed with the plasma 53. Simultaneously with the formation of the plasma 53, the supply of heat from the plasma 53 to the sample 8 is started. When the formation of the plasma or the processing of the sample is started, the present embodiment exhausts the second heat transfer gas region 18. The gas in the region is exhausted at a high speed through the exhaust hole 10 by using the exhaust pump 150 so that the regions 18 is evacuated rapidly and a high degree of vacuum is achieved therein. By thus bringing the second heat transfer region into a high vacuum state at the initial stage of the processing of the sample 8, the maximum heat insulating effect is achieved and the temperature at a position on the sample 8 at a radial distance of about 100 mm, which is located above the second heat transfer region, is increased so that the actual temperature distribution is brought closer to an objective temperature distribution in a shortest possible time.

When the temperature in the second heat transfer region 18 reaches a predetermined temperature, the pressure therein is adjusted to a value which provides the predetermined temperature distribution so that the pressure in the second heat transfer region 18 is brought into a normal state and the predetermined temperature distribution is retained. Specifically, the pressure of the gas is adjusted this time to a highest possible value so that a further temperature increase resulting from the heat supplied from the plasma 53 is suppressed and the temperature is prevented from becoming lower than a required level.

The pressure of the heat transfer gas which provides the second heat transfer region 18 with such a temperature is typically lower than each of the respective heat transfer gasses in the first and third heat transfer regions located on both sides. For the purpose of implementing the temperature distribution shown in FIG. 10, the pressure of the heat transfer gas in the third heat transfer region 19 is adjusted to be higher to provide a high heat transfer rate. In the first heat transfer region 17, the heat transfer rate is relatively lowered and the pressure of the heat transfer gas is adjusted to be lower so that the temperature on the surface of the sample 8 is adjusted to be higher than in the third heat transfer region.

In the second heat transfer region 18, by contrast, the pressure of the heat transfer gas is adjusted to be lower than in either of the first and third heat transfer regions 17 and 19 so that the heat transfer rate is further reduced. Consequently, the temperature of the region of the sample 8 located above the second heat transfer region 18 is adjusted to a higher level so that the temperature distribution across the sample 8 is brought closer to a desired temperature distribution, e.g., the graph 100 in FIG. 10.

The flow of the operation of such pressure adjustment in the second heat transfer gas region 18 is shown in FIG. 13, while the results of temperature distributions across the sample are shown in FIGS. 11 and 12.

First, the temperature of each of the refrigerants in the sample holder 100 is adjusted to a predetermined temperature (Step S1301). Next, the temperature of the refrigerant is sensed by sensing the temperature at the specified position on the sample holder 100 (Step S1302) and compared with specified values (Step S1303). If the temperature is higher than the first predetermined value (high temperature), the flow rate of the refrigerant is increased or the temperature of the refrigerant to supplied is reduced. If the temperature is lower as a result of a comparison with a second predetermined value (low temperature), the flow rate of the refrigerant is reduced or the temperature of the refrigerant to be supplied is higher (Step S1304). Thus, the temperature over the surface of the sample holder 100 on which the sample 8 is placed is adjusted to provide a desired temperature distribution.

The adjustment of the temperature over the sample holder 100 using the refrigerant can be performed either before or after the sample 8 is placed.

Then, the heat transfer gases are supplied to the first, second, and third heat transfer regions 17, 18, and 19 in the same manner as in Steps S1301 to 1304. By using the respective outputs from the temperature sensors 29, 30, and 31 in the individual regions and the pressure adjusting valves 37, 38, and 39, the pressure adjusters 32, 33, and 34 adjust the respective pressures of the heat transfer gases in the individual regions (Step S1305).

If a desired temperature distribution across the sample 8 prior to processing is recognized based on the outputs from the temperature sensors 29, 30, and 31, a plasma is formed by introducing a gas and an electromagnetic wave into the processing chamber 500 located above the sample 8 (Step S1306). If the formation of the plasma is recognized (Step S1307), the pressure adjuster 32 transmits an instruction to lower the pressure in the first heat transfer region 17 to the pressure adjusting valve 37, thereby reducing the opening of the valve (Step S1311). On the other hand, in order to make the pressure in the second heat transfer region 18 lower than the first heat transfer region 17, the pressure adjuster 33 transmits an instruction to each of the pressure adjusting valves 39 and 151 and the exhaust pump 150 to adjust the operations thereof (Step S1308). For example, the opening of the pressure adjusting valve 39 is reduced. Alternatively, the output of the exhaust pump 150 is increased and the opening of the pressure adjusting valve 151 is increased, whereby the speed of exhaust from the exhaust hole 10 is increased.

By the foregoing operation, the pressure in the second heat transfer region 18 is adjusted to be lower than the pressure in the first heat transfer region 17 and lower than the pressure in the third heat transfer region 19 so that a high vacuum state is provided. By minimizing the heat transfer rate in the second heat transmission region 18, the temperature of the region of the sample 8 located above this region is increased rapidly.

Next, the pressure adjuster 33 detects the temperature of the second heat transfer region 18 upon receipt of an output from the temperature sensor 30. If the pressure adjuster 33 senses that the temperature is higher than a predetermined value, it gives an instruction to each of the pressure adjusting valves 39 and 151 and the exhaust pump 150 to adjust the pressure in the second heat transfer region 18 so that the temperature in the region becomes closer to a desired objective temperature (Step S1309). For example, the pressure in the second heat transfer region 18 is increased by increasing the opening of the pressure adjusting valve 39, by reducing the opening of the pressure adjusting valve 151, or by reducing an output from the exhaust pump 150 and thereby reducing the speed of exhaust from the exhaust hole 10. In this case also, the pressure in the second heat transfer region 18 is adjusted to be lower than the pressure of the gas in each of the first and third heat transfer regions 17 and 19 (Step S1310).

In the mean time, the pressure of the gas in the third heat transfer region 19 is adjusted to be substantially equal. Of the three regions, the region of the sample 8 located above the third heat transfer region 19 is a region at the circumferentially outermost position in which the temperature is adjusted to a lowest level, while defining one end which determines a temperature distribution across the sample 8. As shown in FIG. 8, the temperature over the sample 8 preferably has a downwardly inclined distribution shown on the graph such that a lowest temperature is achieved at the outer circumferential end. To implement the temperature, the third heat transfer region is shortest in the radial direction of the sample holder 100 or the sample 8. In the present embodiment, the region defining the other end which determines the temperature distribution across the sample 8 is the first heat transfer region 17. The temperature distribution across the sample holder 100 or the sample 8 in the present embodiment is basically determined by adjusting the respective temperatures in the two regions.

The second heat transfer region 18 disposed between these regions is a portion determining the inclination of temperature variation between the temperature of the region of the sample 8 located above the second heat transfer region 18 and each of the lowest temperature determined in the region of the sample 8 located above the third heat transfer region 19 adjacent to the second heat transfer region 18 on the outer circumferential side thereof and the temperature of the region of the sample 8 closer to the center thereof which is located above the first heat transfer region 17 adjacent to the second heat transfer region 18 on the inner circumferential side thereof. By adjusting the temperature in the second heat transfer region 18, a temperature distribution closer to an ideal temperature distribution is implemented across the sample 8 in which an inflection point for the temperature variation over the sample 8 is provided and the temperature on the surface of the sample is substantially the same to a point closer to the center portion of the sample 8 which is at a given radial distance and the temperature continues to decrease in the region radially external of the position with approach toward the outer periphery.

In the example shown in the foregoing embodiment, heat with which the temperature of the second heat transfer region 18 becomes higher than the predetermined objective value during the processing of the sample 8 is supplied from the plasma. Depending on conditions for processing using the plasma, there are cases where, even if the processing is initiated while relatively low heat is supplied from a plasma and the pressure in the second heat transfer region 18 is maintained at a high degree of vacuum, the temperature in the region 18 and the temperature of the region of the sample 8 located above the region 18 do not reach an objective temperature during the processing. FIG. 12 shows temperature variation in this case.

In this case, even when the pressure in the second heat transfer region 18 is adjusted to approximately 0 KPa after the initiation of processing, the temperature of the sample 8 has not reached an objective temperature during the processing at a position 100 mm apart from the center of the sample 8, which is located above the second heat transfer region 18. In this case also, the inclination of the temperature variation (variation with time in temperature increase) shows that the rate of temperature variation to time variation is higher than in the heat transfer region 19 where the pressure of the supplied heat transfer gas is not varied and that a temperature distribution closer to an ideal temperature distribution across the sample can be realized.

Since the temperature of the sample is lower than a predetermined temperature distribution during the initial period of processing, the temperature at the position in the region of the sample 8 located above the second heat transfer region 18 is increased till it exceeds a predetermined temperature by providing a higher vacuum state and minimizing the heat transfer rate. By thus thinning the sample with a thick configuration as a result of processing in a state lower than the predetermined temperature during the initial period, i.e., in a state in which a larger amount of reaction products is likely to be adhered to the sample, the sample with a final post-processing configuration equivalent to that when a predetermined temperature is obtainable in the initial state is obtainable.

The structure provides a distribution closer to the predetermined temperature distribution even when the processing time is short and reduces an amount of temperature variation till the predetermined temperature distribution is provided.

Thus, the present embodiment allows a temperature gradient to be formed across the sample holder so that a temperature distribution is formed as required across the surface of the sample.

By providing three circulation systems for the heat transfer gases and locally providing high-speed exhausting means, high-precision temperature control can be performed across the surface of the sample.

Since the three refrigerant flow paths can be controlled independently by using the three pressure adjusters, it is possible to freely combine temperature control, flow rate control, and the type of a refrigerant. If it is assumed that only flow rate control is performed, the type and temperature of a refrigerant are fixed. Accordingly, the production of a temperature difference across the surface of the sample is limited and the type of a usable process is also limited.

According to the present embodiment, however, a large temperature difference can be produced across the surface of the sample.

Figure 9:
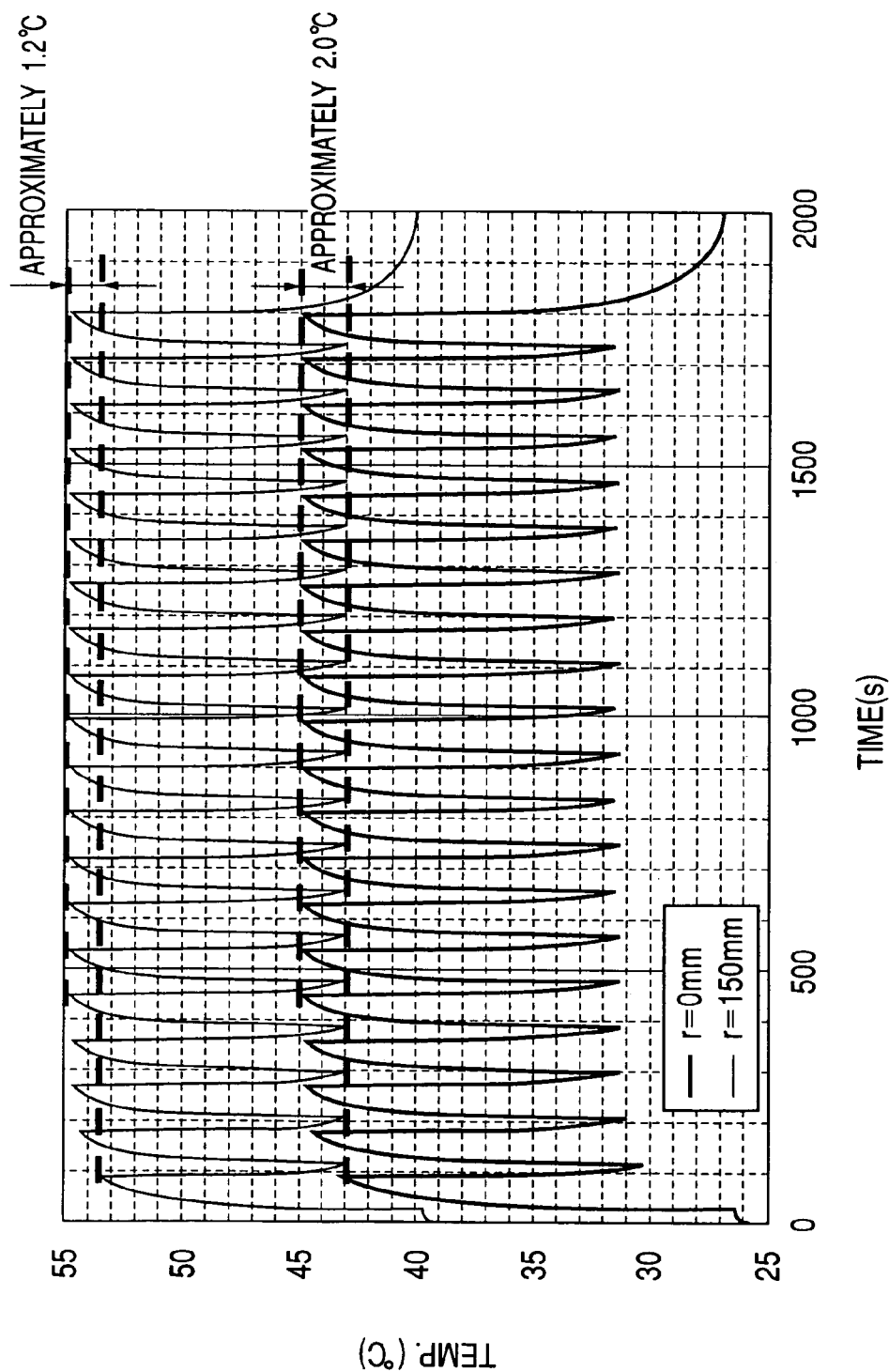
FIG. 9 is a graph showing the transition of the temperatures of a plurality of samples when the processing of the samples are performed continuously.

When a plurality of samples 8 are to be processed continuously, the temperature of the sample holder 100 requires a long time to reach a normal state and the temperatures of the first and second samples are lower than those of the subsequent samples as shown in FIG. 9 so that such a structure is effective in eliminating the problem. Although it has frequently been performed to add a heat input prior to the processing of the samples and thereby hold the temperature of the sample holder in a normal state by using a technique such as aging, it is sufficient to adjust the pressure of the heat transfer gas to be lower only for the first and second samples.

Although the present embodiment has shown a structure using three temperature adjusters, the concept of the present embodiment is applicable without any alteration even to a structure using three or more temperature adjusters. As the number of temperature adjusters is increased, the accuracy with which the temperature profile is feedbacked is increased, which is an object of the present embodiment.

The temperature distribution across the sample holder should be determined depending on the distribution of reaction products formed under the influence of the configurations, placement, and number of refrigerant trenches, the type of a processing gas, the pressure in the process, the position of an exhaust system, and the like. Hence, the placement of the refrigerant flow paths is not limited to the foregoing.

Although the foregoing embodiments have been described by using the plasma etching apparatus as an example, the present invention is widely applicable to a processing apparatus in which a subject to be processed, such as a sample, is processed while being heated in an atmosphere under a reduced pressure. As examples of a processing apparatus using a plasma, there can be listed a plasma etching apparatus, a plasma CVD apparatus, a sputtering apparatus, and the like. As examples of a processing apparatus not using a plasma, there can be listed an ion implantation apparatus, an MBE apparatus, a vapor deposition apparatus, a vacuum CVD apparatus, and the like.

What is claimed is:

1. A plasma processing method for processing a sample by reducing a pressure within a processing chamber comprising the steps of:

mounting the sample an a sample holder disposed in the processing chamber; and processing the sample using a plasma generated in the processing chamber above the sample holder while supplying a gas for heat transfer to a spaces between a surface of the sample holder having the sample mounted thereon and a rear surface of the sample;

wherein the sample holder has a plurality of substantially ring-shaped depressed portions and another depressed portion disposed in a central side of the plural substantially ring-shaped depressed portions at the surface having the sample mounted thereon and a plurality of refrigerant flow oaths inside the sample holder which includes a central flow oath disposed in a central portion and an outer flow path disposed in an outer periphery portion inside the sample holder, wherein said plural substantially ring-shaped depressed portions include an outer circumferential depressed portion disposed on an outer periphery portion of the sample holder and an inner depressed portion disposed on an inner side of the outer circumferential depressed portion; and setting a temperature distribution of the sample holder higher in the central portion than in the outer periphery and a pressure in a space between the sample and the inner depressed portion arranged between the outer circumferential depressed portion and the other depressed portion in the central side to be lower than the pressure in a space between the outer circumferential depressed portion of the sample holder and the sample, and the pressure in a space between the other depressed portion in the central side and the sample.

2. The plasma processing method according to claim 1, further comprising a step of supplying a gas for heat transfer to the space between the depressed portions of the outer circumferential portion of the sample holder and the sample.

3. The plasma processing method according to claim 1, wherein the pressure in the space between the depressed portions at the central portion and the sample is set to be low at an initial processing stage of the sample and subsequently adjusted to be increased.

4. The plasma processing method according to claim 2, wherein the pressure in the space between the depressed portions at the central portion and the sample is set to be law at an initial processing stage of the sample and subsequently adjusted to be increased.

5. A plasma processing method for processing a sample by reducing a pressure within a processing chamber comprising the steps of:

mounting the sample on a sample holder disposed in the processing chamber; and processing the sample using a plasma generated in the processing chamber above the sample holder while supplying a gas for heat transfer to spaces between a surface of the sample holder having the sample mounted thereon and a rear surface of the sample;

wherein the sample holder has a plurality of depressed portions which are substantially concentrically arranged at a surface where the sample is mounted, including a first depressed portion arranged at a central portion of the sample holder, a second substantially ring-shaped depressed portion arranged at an outer circumferential portion with respect to the first depressed portion, and a third substantially ring-shaped depressed portion arranged at an outer circumferential portion with respect to the second depressed portion, and a plurality of refrigerant flow paths inside the sample holder which includes a central flow path disposed in a central portion and an outer flow oath disposed in an outer periphery portion of the sample holder inside the sample holder, and setting a temperature distribution of the sample holder higher in the central portion than in the outer periphery and a pressure in a space between the second depressed portion and the sample to be lower than a pressure in a space between the first depressed portion and the sample, and a pressure in a space between the third depressed portion and the sample.

6. The plasma processing method according to claim 5, wherein a gas for heat transfer is supplied to the space between at least the first depressed portion and the sample and a space between the third depressed portion and the sample.

7. The plasma processing method according to claim 5, wherein the pressure in the space between the second depressed portion and the sample is set to be low at an initial processing stage of the sample and subsequently adjusted to be increased.

8. The plasma processing method according to claim 6, wherein the pressure in the space between the second depressed portion and the sample is set to be low at an initial processing stage of the sample and subsequently adjusted to be increased.

9. The plasma processing method according to claim 5, wherein a temperature at the central portion in the sample holder is adjusted to become a higher value than a temperature at the outer circumferential portion when the sample is processed.

10. The plasma processing method according to claim 6, wherein a temperature at the central portion in the sample holder is adjusted to become a higher value than a temperature at the outer circumferential portion when the sample is processed.

* * * * *